(12) United States Patent
Paak

(10) Patent No.: US 7,760,538 B1
(45) Date of Patent: Jul. 20, 2010

(54) NON-VOLATILE SRAM CELL

(75) Inventor: Sunhom Paak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 165 days.

(21) Appl. No.: 12/042,264

(22) Filed: Mar. 4, 2008

(51) Int. Cl.
  *G11C 11/00* (2006.01)
  *G11C 7/00* (2006.01)
  *G11C 11/34* (2006.01)

(52) U.S. Cl. ............. 365/148; 365/189.05; 365/210.14; 365/225.5; 365/189.2; 365/189.11; 365/49

(58) Field of Classification Search ........................ None
See application file for complete search history.

(56) References Cited

U.S. PATENT DOCUMENTS

| | | | |
|---|---|---|---|
| 6,269,027 B1 * | 7/2001 | Hurst et al. ............ | 365/189.05 |
| 7,079,412 B2 * | 7/2006 | Chen et al. ................... | 365/148 |
| 2003/0156469 A1 * | 8/2003 | Viehmann et al. ........... | 365/200 |
| 2004/0125643 A1 * | 7/2004 | Kang et al. ................. | 365/148 |
| 2006/0181916 A1 * | 8/2006 | Roehr ........................ | 365/148 |

* cited by examiner

*Primary Examiner*—Huan Hoang
*Assistant Examiner*—James G Norman
(74) *Attorney, Agent, or Firm*—W. Eric Webostad; Kevin T. Cuenot

(57) ABSTRACT

A non-volatile static random access memory ("SRAM") cell using variable resistance random access memory ("RAM") cells is described. A memory tri-cell includes an SRAM cell with a first charge node and a second charge node. A first variable resistance random access memory cell is coupled between the first charge node and a supply voltage bus. A second variable resistance random access memory cell is coupled between the first charge node and a ground bus. A first control gate is coupled between the supply voltage bus and the first variable resistance random access memory cell. A second control gate is coupled between the ground bus and the second variable resistance random access memory cell.

20 Claims, 8 Drawing Sheets

NON-VOLATILE SRAM CELL

FIELD OF THE INVENTION

One or more aspects of the invention relate generally to integrated circuits and, more particularly, to a non-volatile static random access memory ("SRAM") cell using at least one of a pull-up memory cell or a pull-down memory cell.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, a design instantiated in programmable logic of an FPGA ("FPGA fabric") was programmed using volatile SRAM cells. It should be appreciated that a relatively complicated circuit instantiated in FPGA fabric may involve programming multiple SRAM cells to store states for programmable logic. On power-off, this information may have been lost unless an FPGA was coupled to an auxiliary power source, such as a battery back-up.

Generally, non-volatile memory products employ flash or electrically erasable programmable read-only memory ("EEPROM") cells. These cells conventionally involve relatively expensive semiconductor process steps to form their associated double polycrystalline silicon ("poly") cell structures over an in-process integrated circuit employing Complementary Metal Oxide Semiconductor ("CMOS") semiconductor logic process.

Accordingly, it would be both desirable and useful to provide a non-volatile SRAM cell for use in an FPGA or other integrated circuit which does not depend on use of EEPROM or flash memory cells.

SUMMARY OF THE INVENTION

One or more aspects of the invention generally relate to integrated circuits and, more particularly, to a non-volatile static random access memory ("SRAM") cell using at least one of a pull-up memory cell or a pull-down memory cell.

An aspect of the invention relates generally to a memory multi-cell that includes a static random access memory ("SRAM") cell with a first charge node and a second charge node. The memory multi-cell includes at least one variable resistance random access memory cell coupled between the first charge node and a common node, and a control gate coupled between the common node and a voltage bus.

Another aspect of the invention relates generally to a method for restoring the logic state of a static random access memory cell. Formed is at least one variable resistance random access memory cell coupled between a charge node of the static random access memory cell and a common node. Furthermore, formed is a control gate coupled between the common node and a voltage bus.

Yet another aspect of the invention relates generally to a method for restoring logic states of a static random access memory cell that is part of a memory multi-cell including the static random access memory cell, at least one variable resistance random access memory cell coupled between a charge node of the static random access memory cell and a common node, and a control gate coupled between the common node and a voltage bus. Obtained is a logic state associated with the static random access memory cell. Determined is at least one bitline voltage coupled to the static random access memory cell to set resistance of the at least one variable resistance random access memory cell. Set is a resistance value of the at least one variable resistance random access memory cell for restoring the logic state of the static random access memory cell.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different. For instance, examples presented may describe embodiments of the invention using an example embodiment in an FPGA; however, the techniques and structures described may be used in any integrated circuit. In particular, any device in which non-volatile memory may be useful may be used with embodiments of the present invention.

Figure 1:
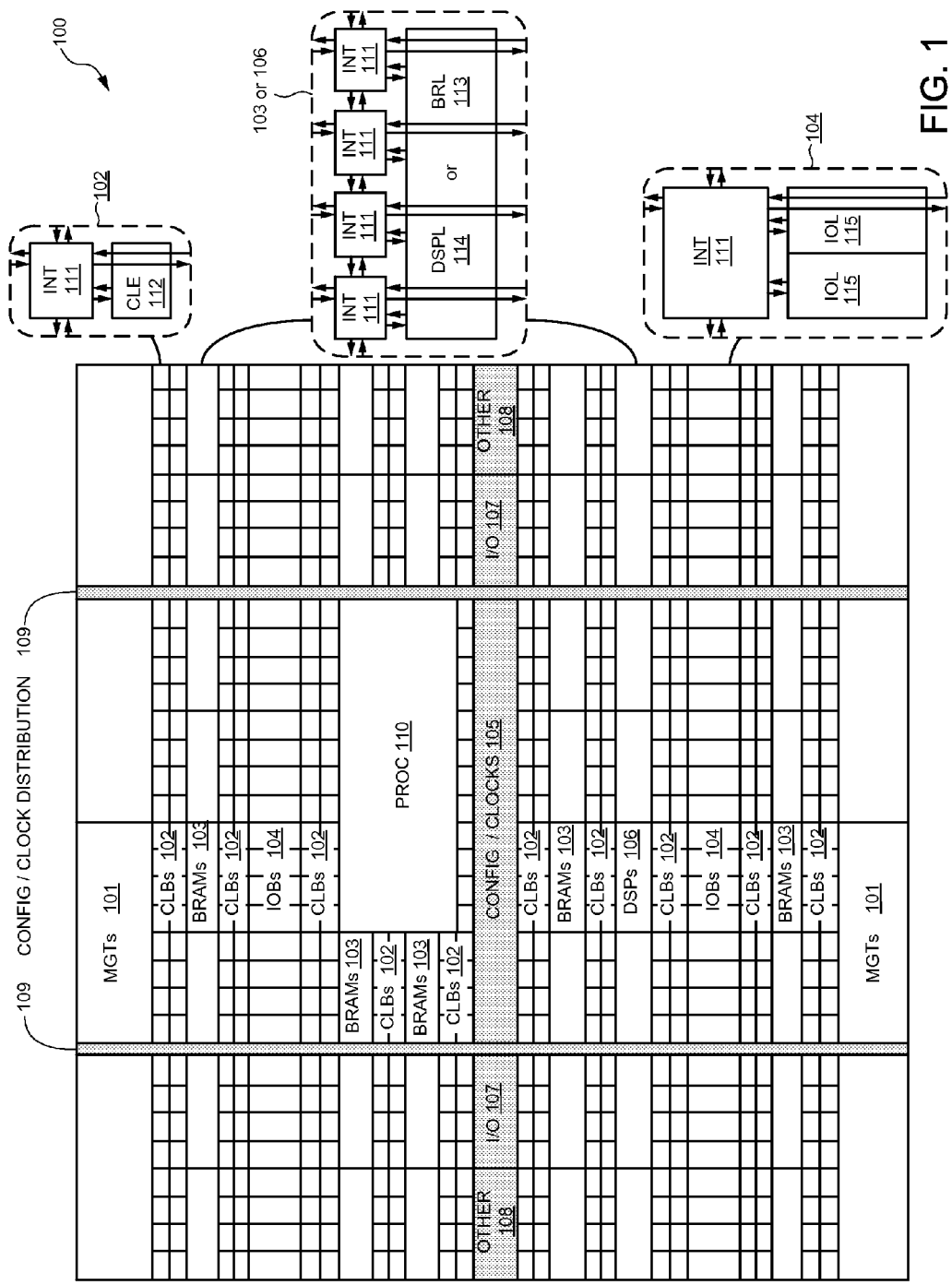
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex™-4 or Virtex™-5 FPGA from Xilinx of San Jose, Calif.

Figure 2:
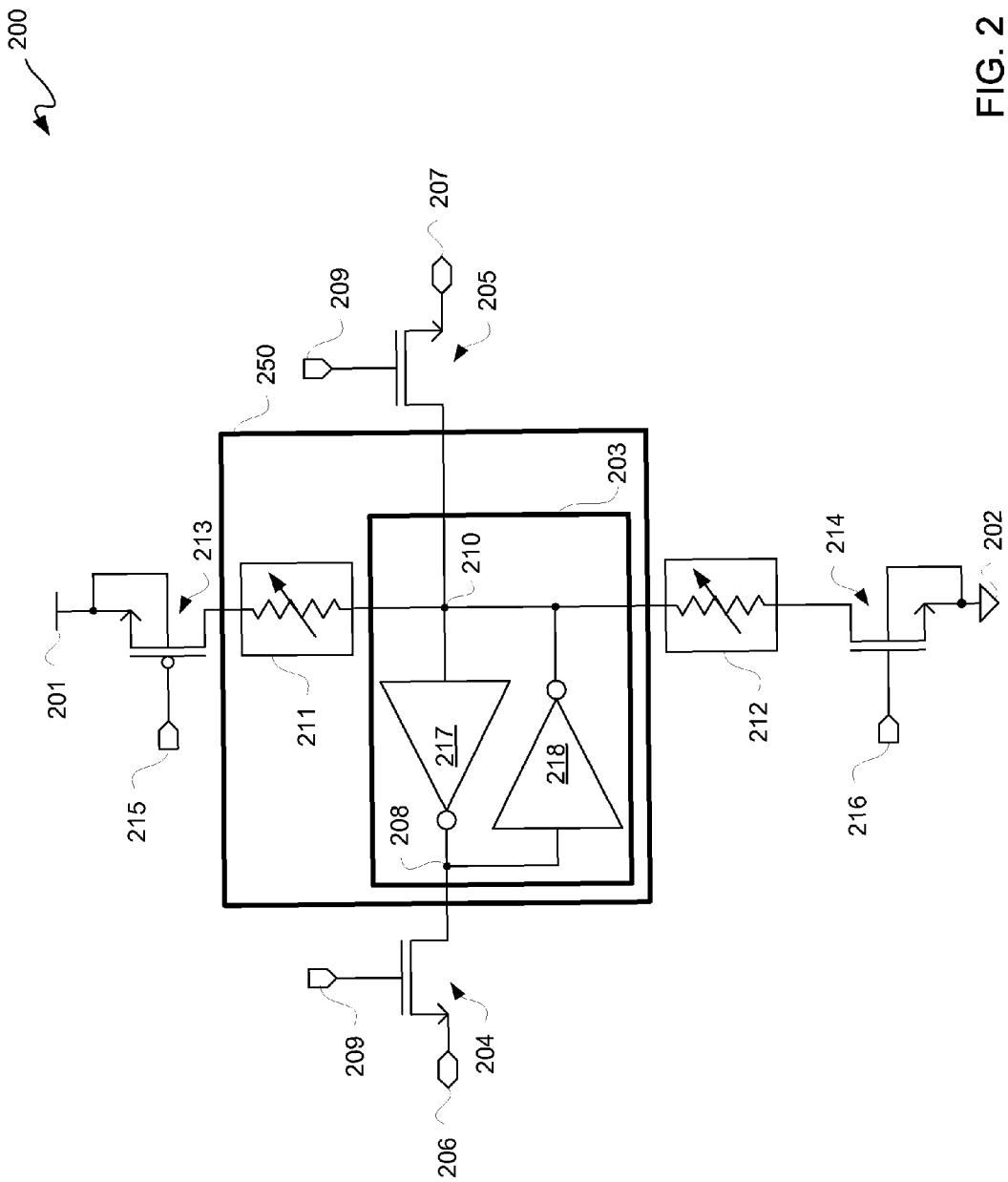
FIG. 2 is a circuit diagram depicting an exemplary embodiment of a memory tri-cell.

FIG. 2 is a circuit diagram depicting an exemplary embodiment of a memory tri-cell circuit 200. By "memory tri-cell," it is meant an SRAM cell 203 with at least two bi-stable state, programmable resistance memory cells 211 and 212. Other cells having different numbers of programmable resistance memory cells are similarly named (e.g., "bi-cell" for a cell having one such programmable resistance memory cell.) Memory tri-cell 250 includes variable resistance random access memory ("RAM") cells 211 and 212, and SRAM cell 203. In addition to memory tri-cell 250, memory tri-cell circuit 200 includes control transistors 213 and 214, and bitline access transistors 204 and 205. Wordline 209, bitlines 206 and 207, and bitline access transistors 204 and 205 as associated with SRAM cell 203 are well known, and thus are not described in unnecessary detail herein. Even though the phrase "variable resistance" is used herein, it should be understood that a sliding scale resistance may be used but is not required. Rather, as shall become more apparent from the following description, "variable resistance" as used herein means having at least two states which are sufficiently stable after programming and which are sufficiently different in resistance value.

Figure 3:
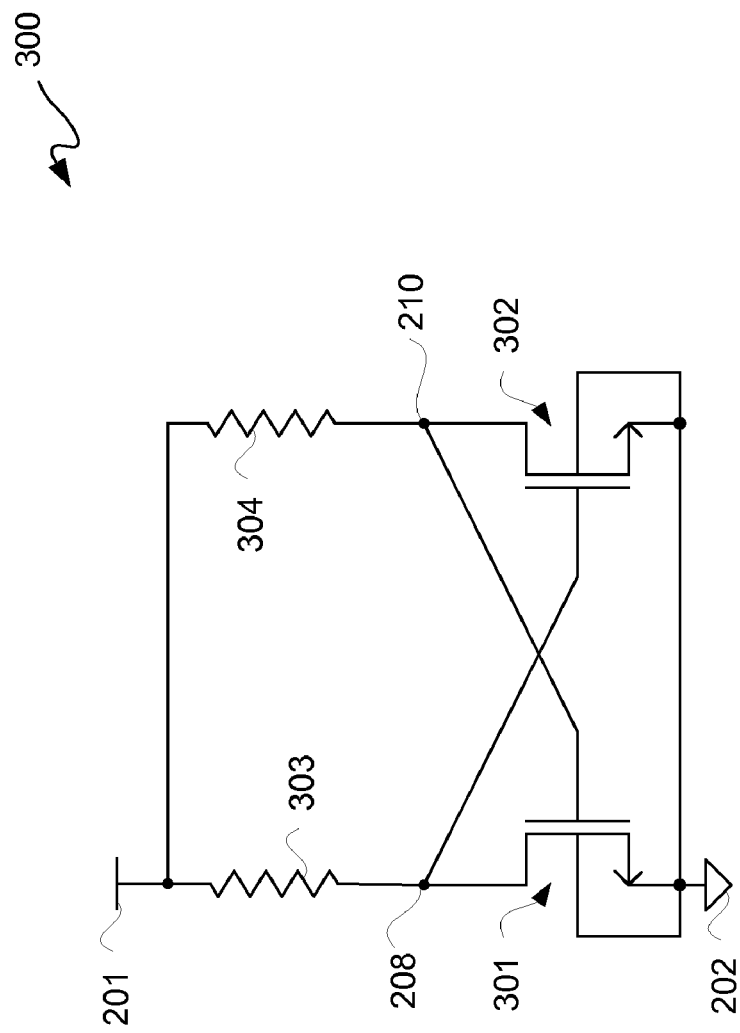
FIG. 3 is a circuit diagram depicting an exemplary embodiment of an SRAM cell with polycrystalline silicon ("poly") resistors and cross-coupled NMOS transistors.

In the example embodiment of SRAM cell 203 illustratively shown, a CMOS SRAM cell is illustratively shown having inverters 217 and 218 coupled as a closed loop, namely a latch circuit, with input/output nodes ("charge nodes") 208 and 210. Although a CMOS SRAM cell is illustratively shown, it should be appreciated that other known types of SRAM cells may alternatively be used for SRAM cell 203. For example, with reference to FIG. 3, there is shown a circuit diagram depicting an exemplary embodiment of an SRAM cell 300 with poly resistors 303 and 304 and cross-coupled NMOS transistors 301 and 302. As SRAM cell 300 and variations thereof are well known, SRAM cell 300 is not described in unnecessary detail.

Returning to the description of memory tri-cell circuit 200 of FIG. 2, variable resistance RAM cells 211 and 212 may be implemented with any of a variety of known types of variable resistance RAM cells, including magnetic RAM ("MRAM") cells, material phase change RAM cells, and poly resistor-based RAM cells. Although any of such known variable resistance RAM cells may be used for memory cells 211 and 212, MRAM cells will generally be described herein for purposes of illustration by way of example and not limitation.

In contrast to the complexity associated with integrating flash and EEPROM semiconductor processes in a CMOS process, an MRAM semiconductor process conventionally uses only three to four more layers on top of a conventional CMOS semiconductor logic process. These three or four more additional layers conventionally are less expensive than the process steps associated with forming the double poly cell structures associated with flash and EEPROM cells. Additionally, an MRAM cell is conventionally operated using the same supply of voltage, Vcc or Vdd, associated with powering SRAM cell 203. Moreover, MRAM has a fast access time, which may be substantially equivalent to that of SRAM.

In this example embodiment, control transistor 213 is a p-type transistor having its source coupled to a supply voltage 201, such as Vcc or Vdd, and having its drain node coupled to a pull-up variable resistance RAM cell 211. A gate of control transistor 213 is coupled to receive a control voltage 215. A drain node of pull-up variable resistance RAM cell 211 is coupled to charge node 210 of SRAM cell 203. Either or both of charge nodes 208 and 210 may be coupled to a variable resistance pull-up circuit to restore a logic state of SRAM cell 203 after power cycling thereof without having to reprogram SRAM cell 203 via bitlines 206 and 207. Correspondingly, either or both of charge nodes 208 and 210 may be coupled to a variable resistance pull-down circuit to restore a logic state of SRAM cell 203 after power cycling thereof without having to reprogram SRAM cell 203 via bitlines 206 and 207. Moreover, as shall become more apparent from the following description, SRAM cell 203 need not be programmed prior to programming variable resistance RAM cells 211 and 212.

Continuing the example of an embodiment using charge node 210, pull-down variable resistance RAM cell 212 is coupled to charge node 210. Pull-down variable resistance RAM cell 212 is further coupled to a drain node of control transistor 214. A source node of n-type control transistor 214 is coupled to ground 202. Supply voltage 201 and ground 202 may illustratively respectively represent a supply voltage bus and a ground bus of an integrated circuit, such as FPGA 100 of FIG. 1. A gate of control transistor 214 is coupled to receive a control voltage 216.

Even though control transistor 213 is illustratively shown as a p-type transistor and control transistor 214 is illustratively shown as an n-type transistor, both could be p-type or both could be n-type, or they may be switched, namely where control transistor 213 is n-type and control transistor 214 is p-type.

Memory tri-cell 250 may be used for configuration memory of programmable logic of a programmable logic device, such as FPGA 100 of FIG. 1. Alternatively, memory tri-cell 250 may be integrated with other types of integrated circuits having embedded SRAM cells. It should be appreciated that use of variable resistance RAM cells 211 and 212 with SRAM cell 203 allows for non-volatile memory storage with access times associated with doing reads and writes equivalent to that of known SRAM capabilities. In other words, memory tri-cell 200 may perform at speeds equivalent to those of conventional SRAM, but unlike conventional SRAM, memory tri-cell 250 is non-volatile, namely it does not require reprogramming after powering off in order to restore state of SRAM cell 203.

While a variety of configurations are possible, again it shall be assumed that SRAM cell 203 is a CMOS SRAM cell, and that variable resistance RAM cells 211 and 212 are MRAM cells. A couple of reasons for using MRAM cells are: use of MRAM cells with a CMOS SRAM cell is highly compatible as both may be operated at the same supply voltage level; and MRAM semiconductor processing may merely involve an additional three or four more layers on top of a conventional CMOS semiconductor process flow used to produce SRAM cell 203.

Programming of variable resistance RAM cells 211 and 212 of memory tri-cell 250 is described below. In an example embodiment, assume that charge node 210 when programmed is to be at a logic high voltage or logic 1 state. For such a condition, resistance associated with pull-up variable resistance RAM cell 211 may be set to a low resistance value.

Conversely, pull-down variable resistance RAM cell 212 may be set to a high resistance level. It should be appreciated that for example if resistance of pull-up variable resistance RAM cell 211 is set to approximately 1 ohm ("Ω") and resistance of pull-down variable resistance cell 212 is set to approximately 1 kilo-ohm ("KΩ"), then voltage appearing at charge node 210 will substantially closer to a voltage level of supply voltage 201 than to that of ground 202. Additionally, the converse also applies, as described below in additional detail. One or more of these numerical examples may be changed to other known programmable resistance values.

Continuing the example of charge node 210 being at a logic high level voltage when SRAM cell 203 is programmed, wordline 209 may be brought to a logic high level or greater to cause access transistor 205 to be in a conductive state, and control voltage 216 may be brought to a logic low level to electrically decouple pull-up variable resistance RAM cell 212 from ground 202. A bitline voltage may be applied to bitline 207, which as access transistor 205 is in a conductive state is conducted to charge node 210. Only one side of SRAM cell 203 is used, as this reduces semiconductor area usage in comparison to using both sides of SRAM cell 203, which for example may involve two pull-up and two pull-down variable resistance RAM cells.

Control voltage 215 may be at a logic low level causing p-type transistor 213 to couple supply voltage 201 to pull-up variable resistance RAM cell 211. Accordingly, the difference in voltage between supply voltage 201 and voltage at charge node 210, as supplied from bitline 207, may be used to set the resistance value of pull-up variable resistance RAM cell 211. Again, continuing the above example, it shall be assumed that pull-up variable resistance RAM cell 211 is set to approximately 1Ω. The numerical examples used herein are merely for purposes of explanation, and are not intended in any way to limit the scope of this disclosure, as it shall be appreciated that any of a variety of resistance values may be used. Furthermore, programming of variable resistance RAM cells using voltage differences is well known, and thus is not described herein in unnecessary detail.

After pull-up variable resistance RAM cell 211 is set to a target or at least to approximate a target resistance value, voltage on wordline 209 may be toggled to a logic low level to put access transistor 205 in a non-conductive state. By "conductive" and "non-conductive" as used herein, it is generally meant that such states may be at least substantially conductive or substantially non-conductive, respectively, as is well known in operation of transistors.

Having now set a resistance value for pull-up variable resistance RAM cell 211, a resistance value may be set for pull-down variable resistance RAM cell 212. To set a resistance value for pull-down variable resistance RAM cell 212, wordline voltage is again applied to wordline 209 to cause access transistor 205 to be placed in a conductive state. In a conductive state, access transistor 205 may pass another bitline voltage on bitline 207, where this bitline voltage is for setting a resistance value for pull-down variable resistance RAM cell 212. In order to avoid unprogramming or corrupting the programming of pull-up variable resistance RAM cell 211, control voltage 215 may be first applied prior to conducting bitline voltage to charge node 210. In other words, control voltage 215 may be at a logic high level voltage to cause pull-up variable resistance RAM cell 211 to be electrically decoupled from supply voltage 201 by placing control transistor 213 is a nonconductive state.

With pull-up variable resistance RAM cell 211 electrically decoupled from supply voltage 201, bitline voltage to program pull-down variable resistance RAM cell 212 is provided to charge node 210. Additionally, control voltage 216 is provided, in this example, as a logic high voltage level to place control transistor 214 in a conductive state. For transistor 214 in a conductive state, pull-down variable resistance RAM cell 212 is coupled to ground 202. Accordingly, the voltage difference between the voltage appearing at charge node 210 and ground 202 may be used to set a resistance value for pull-down variable resistance RAM cell 212. Again, programming voltage differences used to program variable resistance RAM cells are known, and thus are not described in unnecessary detail herein. Continuing the above example, pull-down variable resistance RAM cell 212 may be set to a target value, or at least approximately to a target value, which in the above example is 1 KΩ. Again, the use of this particular numerical example is merely for purposes of explanation, and in no way is the scope of this disclosure intended to be limited to such numerical example, as it should be well understood that any of a variety of resistances may be used.

Thus with pull-up variable resistance RAM cell 211 programmed to a resistance value which is substantially lower than the resistance value programmed to pull-down variable resistance RAM cell 212, it should be appreciated that after SRAM cell 203 has been power cycled for example, that state of charge node 210 may be restored by putting both control transistors 213 and 214 in a conductive state, which in turn restores the state of SRAM cell 203. This restoration of state is independent of bitline programming via bitlines 206 and 207. More particularly, both control transistor 213 and control transistor 214 may be put in conductive states responsive to control voltages 215 and 216 being at logic low and logic high levels, respectively.

With both control transistors 213 and 214 in a conductive state, a voltage divider is created. For purposes of clarity by way of example and not limitation, resistance associated with control transistor 213 and 214 are ignored as they may be substantially small. Accordingly, voltage appearing at charge node 210 may generally be expressed as the supply voltage 201 times the ratio of the resistance programmed into pull-down variable resistance RAM cell 212 divided by the total resistance of resistances programmed into variable resistance RAM cells 211 and 212, or:

$$\text{Charge Node Voltage} \cong \text{Supply Voltage} \left( \frac{\text{Pull-down Programmed Variable Resistance}}{\text{Total Programmed Variable Resistance}} \right)$$

Thus, if resistance of pull-down variable resistance RAM cell 212 is substantially greater than the resistance programmed into variable resistance RAM cell 211, voltage at charge node 210 approximates supply voltage 201, namely approximates Vcc or Vdd.

Conversely, if in the example pull-up variable resistance RAM cell 211 is programmed to approximately 1 KΩ and pull-down variable resistance RAM cell 212 is programmed to approximately 1Ω, then using the same equation described above, voltage at charge node 210 will approximate ground potential, namely ground 202 or 0 volts. Accordingly, it should be appreciated that any order of programming with respect to setting resistance values for pull-up and pull-down variable resistance RAM cells 211 and 212 may be used. However, it should further be appreciated that the variable resistance RAM cell not being programmed may be decoupled, either from supply voltage 201 or ground 202, as applicable, prior to providing a resistance setting programming voltage to charge node 210.

Voltage at charge node 210, namely the set voltage, may be set for either a logic 1 or a logic 0 voltage level responsive to resistance values programmed into variable resistance RAM cells 211 and 212. Whether voltage at charge node 210 is set for a logic 1 or a logic 0 voltage level depends on the state SRAM cell 203 is to have.

Figure 4A:
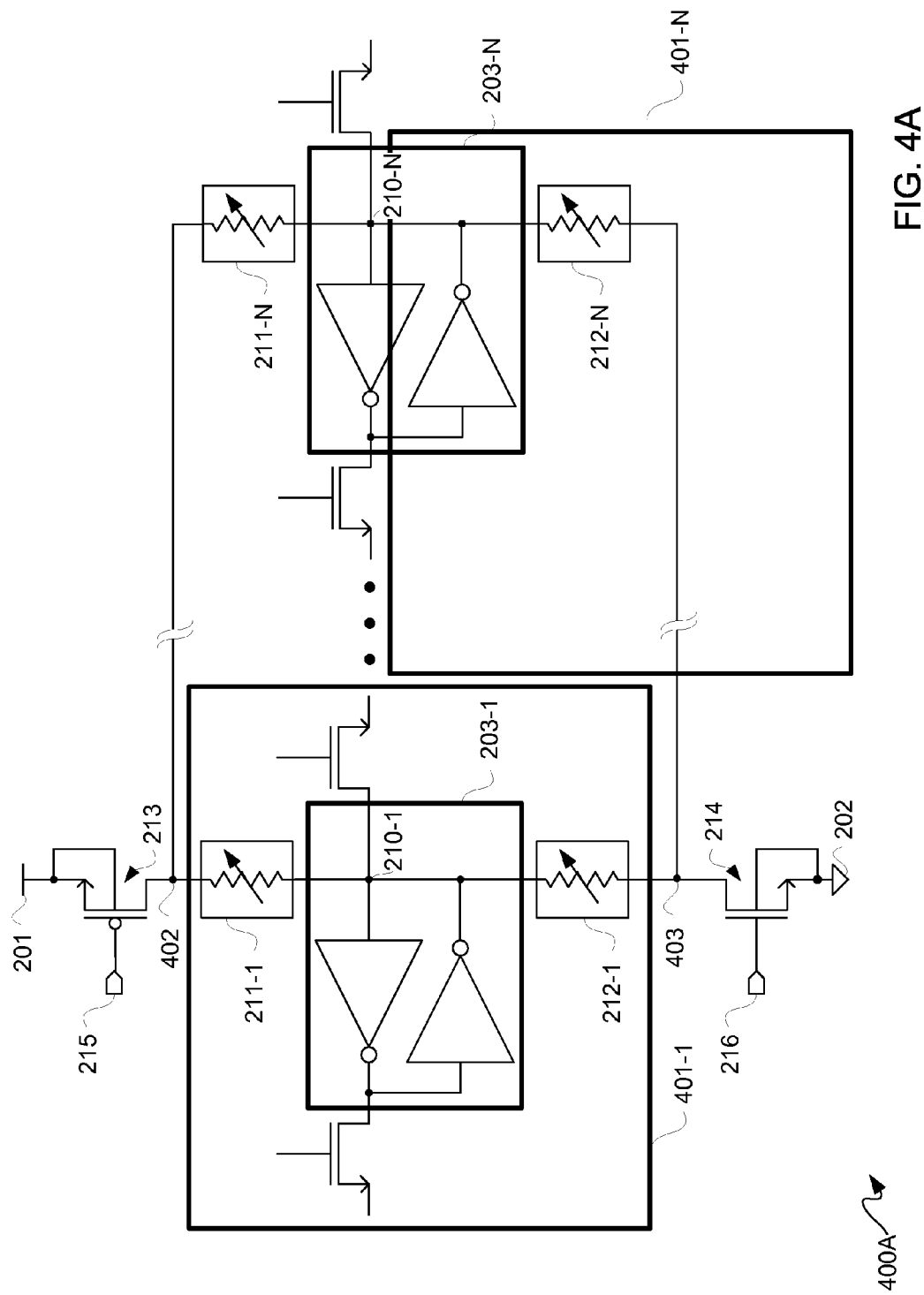
FIGS. 4A through 4D are circuit diagrams depicting respective exemplary embodiments of an array of memory tri-cells.

It should be appreciated that programmable logic conventionally involves more than a single SRAM cell. Thus, there may be multiple SRAM cells associated with programming programmable logic for instantiation of a circuit design. FIG. 4A is a circuit diagram depicting an exemplary embodiment of an array 400A of memory tri-cells 401-1 through 401-N, for N a positive integer greater than one. Each memory tri-cell 401-1 through 401-N includes a respective SRAM cell 203-1 through 203-N, as well as respective pull-up variable resistance RAM cells 211-1 through 211-N and pull-down variable resistance RAM cells 212-1 through 212-N. Bitline access transistors are illustratively shown as being part of such memory tri-cells 401-1 through 401-N for convenience.

However, rather than individually applying control voltages 215 and 216 for each individual variable resistance RAM cell, as previously described with reference to FIG. 2, control transistors 213 and 214 may be sized for use of "global" control voltages 215 and 216. Thus, located between a drain node of control transistor 213 and pull-up variable resistance RAM cells 211-1 through 211-N may be a common node 402. Accordingly, by applying control voltage 215 to control transistor 213, pull-up variable resistance RAM cells 211-1 through 211-N are all electrically coupled or all electrically decoupled from supply voltage 201. Bitlines associated with memory tri-cells 401-1 through 401-N are still conventionally accessible for providing programming voltages for setting resistance values to individual pull-up variable resistance RAM cells 211-1 through 211-N, as well as pull-down variable resistance RAM cells 212-1 through 212-N. Likewise, application of control voltage 216 to control transistor 214 may be used to electrically couple or electrically decouple all of pull-down variable resistance RAM cells 212-1 through 212-N respectively to and from ground 202. Thus, a common node 403 may be located between a drain node of control transistor 214 and pull-down variable resistance RAM cells 212-1 through 212-N.

Figure 4B:
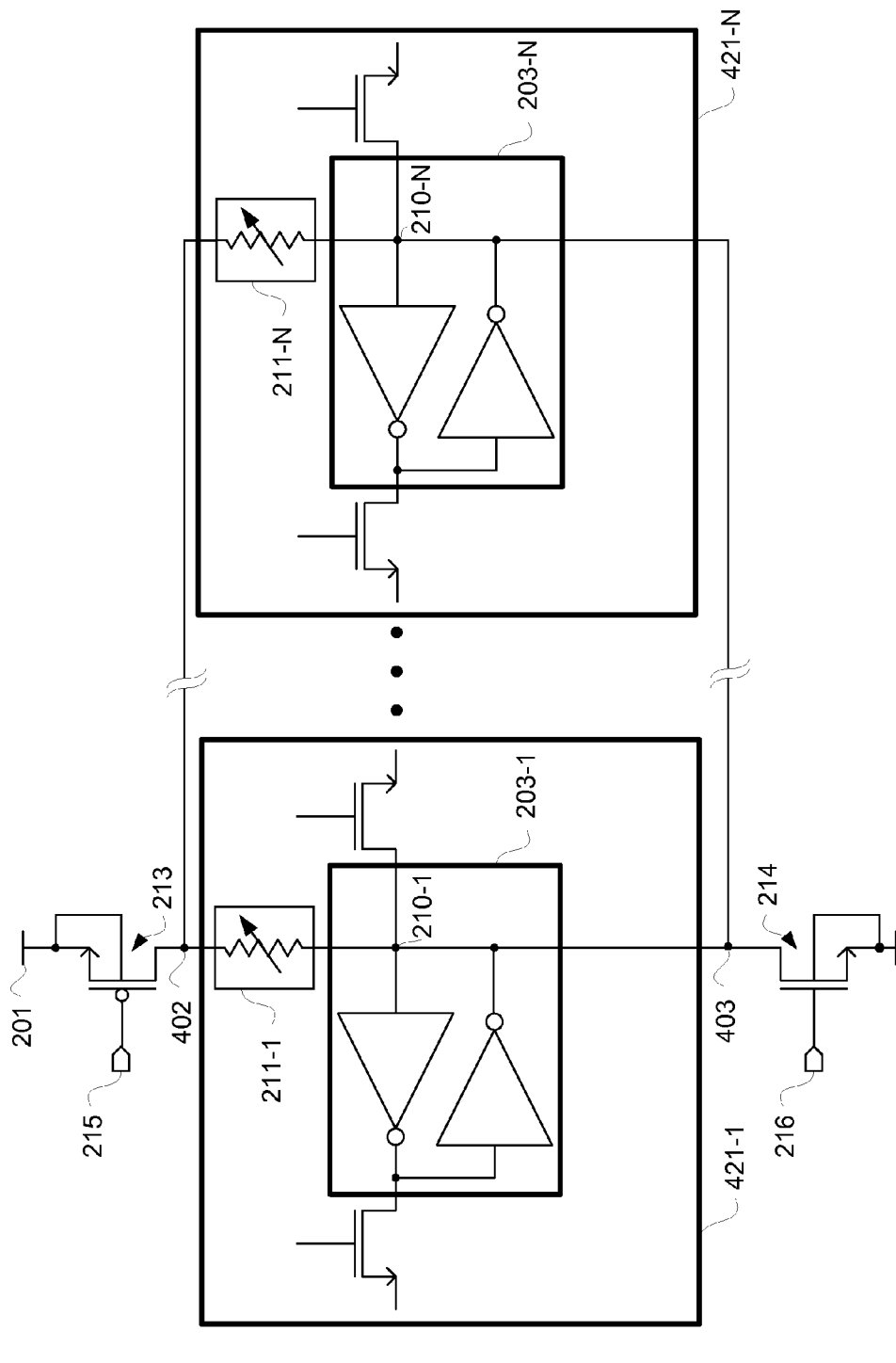

FIG. 4B is a circuit diagram depicting an exemplary embodiment of an array 400B of memory bi-cells 421-1 through 421-N. FIG. 4B is the circuit diagram of FIG. 4A but with variable resistance RAM cells 212-1 through 212-N removed and replaced with conductive lines making nodes 210-1 through 210-N common node with node 403.

Figure 4C:
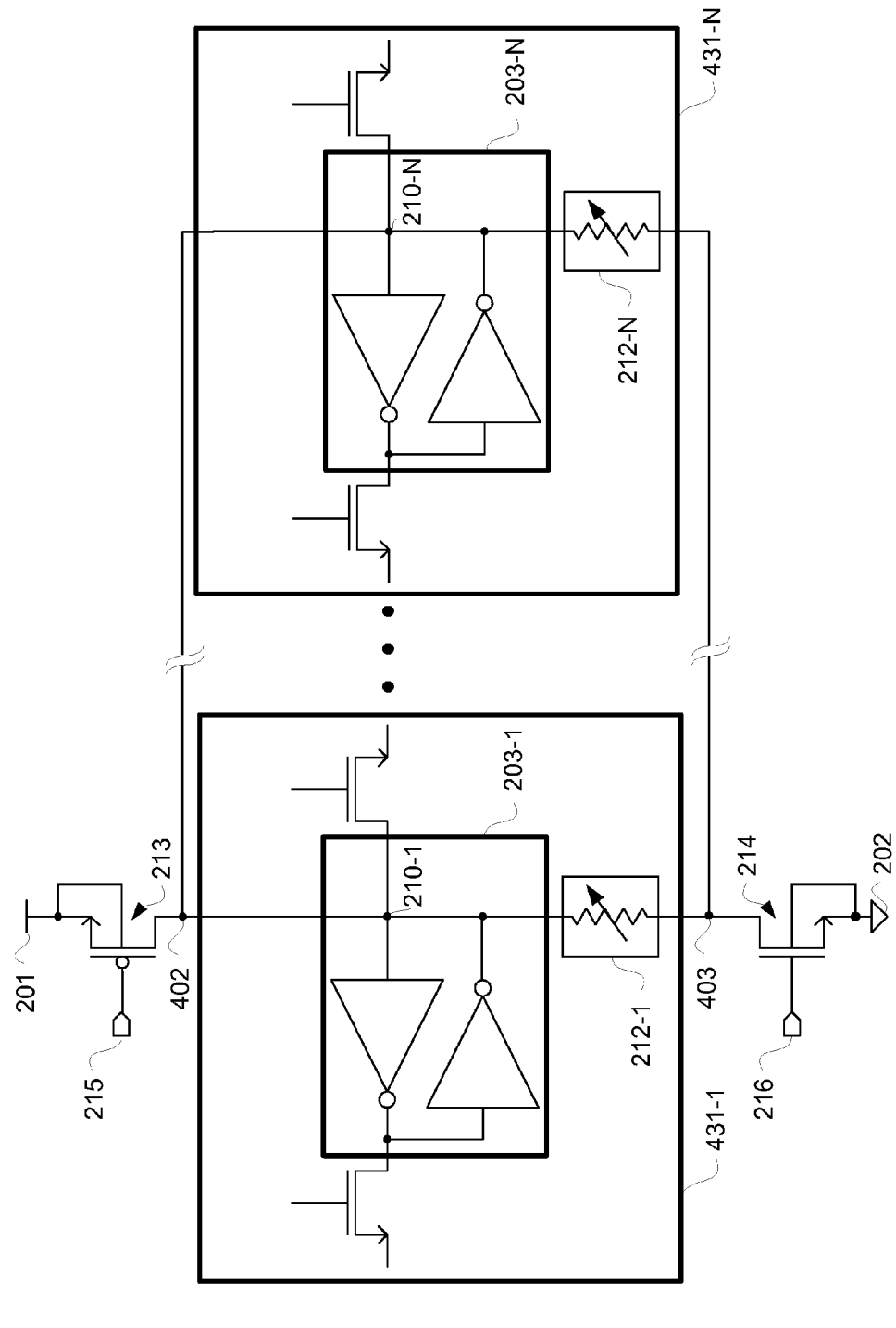

FIG. 4C is a circuit diagram depicting an exemplary embodiment of an array 400C of memory bi-cells 431-1 through 431-N. FIG. 4C is the circuit diagram of FIG. 4A but with variable resistance RAM cells 211-1 through 211-N removed and replaced with conductive lines making nodes 210-1 through 210-N common node with node 403.

For arrays 400B and 400C respectively of FIGS. 4B and 4C, a sufficient amount of voltage drop across variable resistance RAM cells 211-1 through 211-N or variable resistance RAM cells 212-1 through 212-N, respectively, as compared to voltage drop across transistors 213 and 214, respectively, when a conductive state may be needed.

Figure 4D:
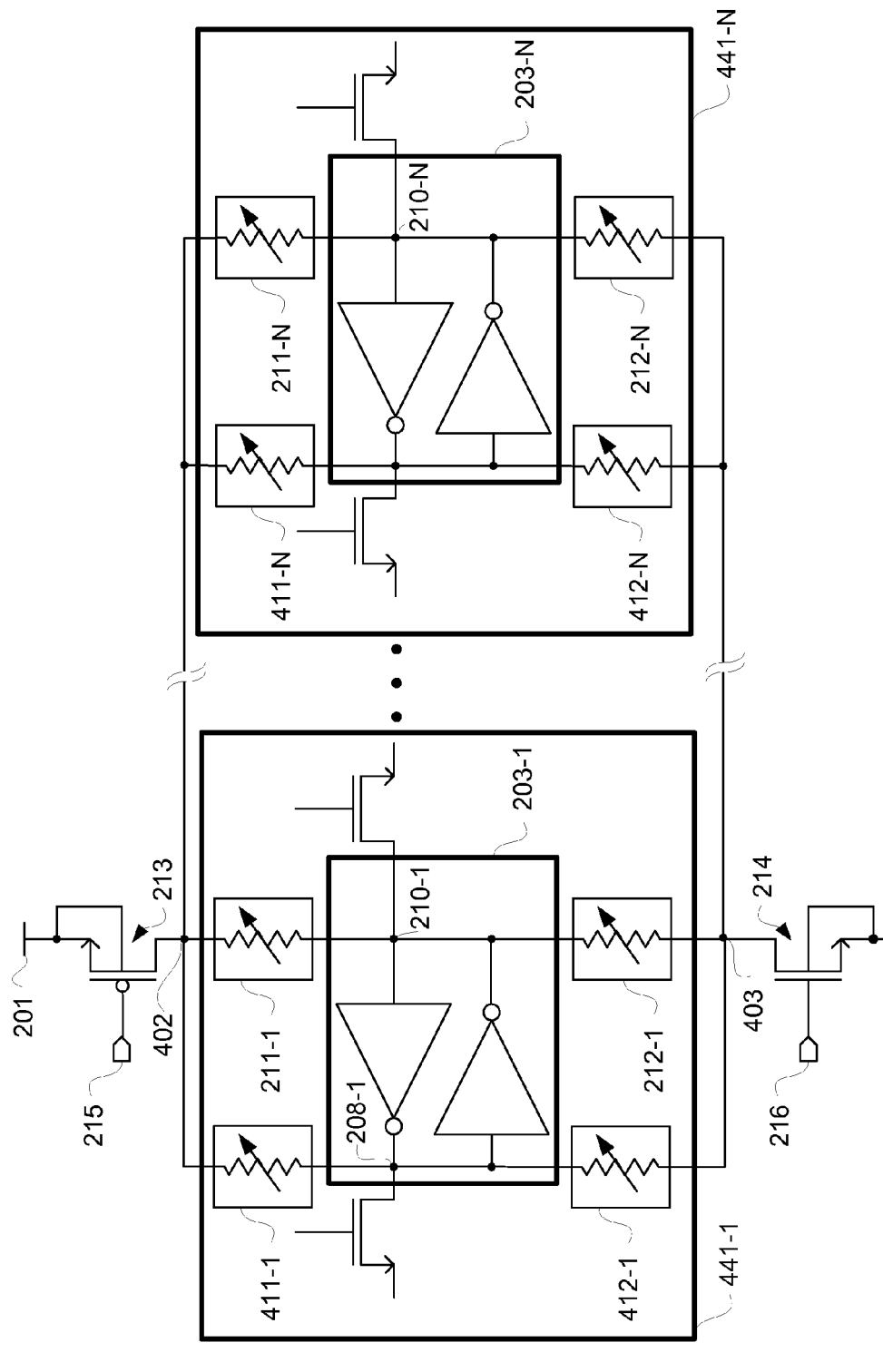

FIG. 4D is a circuit diagram depicting an exemplary embodiment of an array 400D of memory penta-cells 441-1 through 441-N. FIG. 4D is the circuit diagram of FIG. 4A but with pull-up variable resistance RAM cells 411-1 through 411-N and pull-down variable resistance RAM cells 412-1 through 412-N added. Variable resistance RAM cells 411-1 through 411-N are respectively coupled between charge nodes 208-1 through 208-N and common node 402. Variable resistance RAM cells 412-1 through 412-N are respectively coupled between charge nodes 208-1 through 208-N and common node 403. Pull-up variable resistance RAM cells 411-1 through 411-N and pull-down variable resistance RAM cells 412-1 through 412-N may be added for additional protection against cell bit disturbance, or alternative for additional assistance for bit retention after removal of power. Additionally, having quad variable resistance RAM cells as described with reference to memory penta-cells 441-1 through 441-N may cause such memory penta-cells 441-1 through 441-N to more quickly return to a programmed state after power is restored. Note that FIGS. 4A-4D merely describe several example embodiments, and in general other arrangements using fewer or more pull-up and/or pull-down variable resistance RAM cells may be used, depending on the needs of a particular application. In general, each arrangement will have at least one variable resistance RAM cell coupled between a charge node of an SRAM cell and a common node, and a control gate coupled between the common node and a voltage bus, such as a supply voltage bus (coupled to a supply voltage) or a ground bus (coupled to ground).

Figure 5:
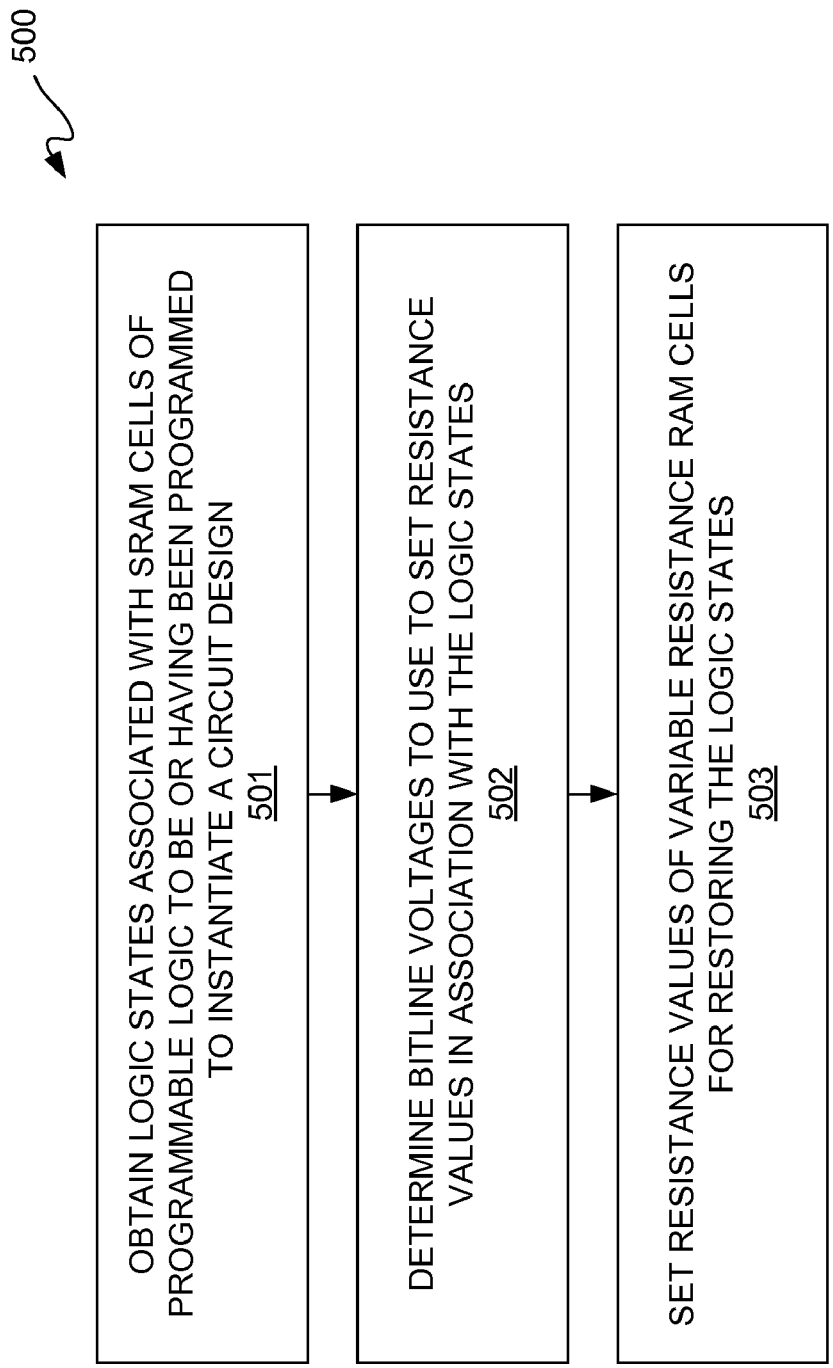
FIG. 5 is a flow diagram depicting an exemplary embodiment of a programming flow.

FIG. 5 is a flow diagram depicting an exemplary embodiment of a programming flow 500. With reference to FIGS. 2 and 4, programming flow 500 is described. Programming flow 500 is for setting resistance values of variable resistance RAM cells, such as variable resistance RAM cells 211-1 through 211-N and 212-1 through 212-N of FIG. 4.

At 501, logic states associated with SRAM cells of programmable logic to be or having been programmed to instantiate a circuit design are obtained. Accordingly, these logic states may be associated with SRAM cells 203-1 through 203-N of FIG. 4.

At 502, bitline voltages used to set resistance values for variable resistance RAM cells are determined in association with the logic states obtained at 501. In other words, the logic level voltages at charge nodes 210-1 through 210-N respectively associated with SRAM cells 203-1 through 203-N are determined such that voltage differences used to set resistance values may be correctly applied.

At 503, resistance values of variable resistance RAM cells, such as variable resistance RAM cells 211-1 through 211-N and 212-1 through 212-N, are set for programming or restoring the logic states obtained at 501. Such logic states may be restored after powering off the SRAM cells, such as SRAM cells 203-1 through 203-N of FIG. 4, without having to reprogram such SRAM cells via associated bitlines thereof. Additionally, it should be appreciated that once resistance values are set for SRAM cells 211-1 through 211-N and 212-1 through 212-N for example, effectively SRAM cells 203-1 through 203-N have been programmed. Thus, an initial programming of such SRAM cells 203-1 through 203-N via application of opposite logic voltage levels to bitline pairs need not be done. Furthermore, it should be appreciated that for purposes of global application of control voltages 215 and 216, all pull-down variable resistance RAM cells 212-1 through 212-N may be electrically decoupled from ground, and all pull-up variable resistance RAM cells 211-1 through 211-N may be programmed, and then all pull-up variable resistance RAM cells 211-1 through 211-N may be electrically decoupled from supply voltage 201 and all pull-down variable resistance RAM cells 212-1 through 212-N may be programmed. Alternatively, the reverse order of programming of pull-up and pull-down variable resistance RAM cells may be used.

Thus, when an integrated circuit is powered up, and global control transistors 213 and 214 are placed in conductive states, voltages at charge nodes 210-1 through 210-N between pull-up and pull-down variable resistance RAM cells are defined by the resistance ratios for either pulling up or pulling down voltage at such charge nodes.

For a substantially large SRAM cell array to handle standby leakage current associated with increased size of control transistors 213 and 214, such transistors may be coupled to one row or one block of memory tri-cells 401-1 through 401-N to reduce leakage current after configuration of SRAM cells 203-1 through 203-N. Furthermore, the term "global" as used herein may apply to all or a grouping of SRAM cells on a die. Additionally, for example, a row, a column, or a block of SRAM cells may be programmed at one time, where all such SRAM cells are set to a same state. For example, if all SRAM cells in a grouping are to be inactive, then all such SRAM cells may be programmed via setting pull-down resistance and pull-up resistance of associated variable resistance RAM cells to respective same sets of values.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A memory multi-cell circuit, comprising:
   a static random access memory ("SRAM") cell having a first charge node and a second charge node;
   at least one variable resistance random access memory cell external to the SRAM cell and coupled between the first charge node and a common node; and
   a control gate coupled between the common node and a voltage bus, wherein the control gate couples to the SRAM cell only through the at least one variable resistance random access memory cell and the at least one variable resistance random access memory cell is coupled to the SRAM cell at a single node.

2. The memory multi-cell circuit according to claim 1, wherein the at least one variable resistance random access memory cell comprises a single variable resistance magnetic random access memory cell.

3. The memory multi-cell circuit according to claim 1, wherein the at least one variable resistance random access memory cell comprises at least four variable resistance a material phase change random access memory cells.

4. The memory multi-cell circuit according to claim 1, wherein the at least one variable resistance random access memory cell comprises a polysilicon resistor-based random access memory cell.

5. The memory multi-cell circuit according to claim 1, wherein the static random access memory cell is a CMOS static random access memory cell.

6. The memory multi-cell circuit according to claim 1, wherein the static random access memory cell includes at least one polysilicon resistor.

7. The memory multi-cell circuit according to claim 1, wherein the control gate is a transistor having a source node coupled to the voltage bus and a drain node coupled to the common node.

8. The memory multi-cell circuit according to claim 1, wherein the memory multi-cell circuit is a configuration memory cell of programmable logic.

9. The memory multi-cell circuit according to claim 1, wherein the programmable logic is part of a programmable logic device.

10. The memory multi-cell circuit according to claim 1, wherein the voltage bus is a voltage bus selected from the group consisting of a supply voltage bus and a ground bus.

11. The memory multi-cell circuit according to claim 1, wherein the voltage bus is a supply voltage bus, the memory multi-cell circuit further comprising:
- a second variable resistance random access memory cell coupled between the first charge node and a second common node; and
- a second control gate coupled between the second common node and a ground bus.

12. The memory multi-cell circuit according to claim 1, further comprising:
- a second variable resistance random access memory cell coupled between the second charge node and a second common node; and
- a second control gate coupled between the second common node and a second voltage bus.

13. A method for restoring state of a static random access memory cell, comprising:
- forming at least one variable resistance random access memory cell coupled between a charge node of the static random access memory cell and a common node, wherein the at least one variable resistance random access memory cell is formed external to the static random access memory cell; and
- forming a control gate coupled between the common node and a voltage bus, wherein the control gate couples to the SRAM cell only through the at least one variable resistance random access memory cell and the at least one variable resistance random access memory cell is coupled to the SRAM cell at a single node.

14. The method according to claim 13, further comprising:
- applying a wordline voltage to place an access transistor of the static random access memory cell in a conductive state for passing a first bitline voltage to the charge node;
- placing the control gate in a conductive state for coupling the voltage bus to the at least one variable resistance random access memory cell;
- using a difference between a voltage of the voltage bus and the first bitline voltage to set a resistance value for the at least one variable resistance random access memory cell;
- powering off the static random access memory cell;
- powering up the static random access memory cell; and
- putting the control gate in the conductive state for coupling the voltage bus to the at least one variable resistance random access memory cell;
- the putting of the control gate in the conductive state forming at least part of a voltage divider formed including the resistance value to provide a set voltage at the charge node for the restoring of the state of the static random access memory cell.

15. The method according to claim 13, wherein the voltage bus is a supply voltage bus, the method further comprising:
- forming a second variable resistance random access memory cell coupled between the charge node of the static random access memory cell and a second common node; and
- forming a second control gate coupled between the second common node and a ground bus.

16. A method for restoring state of a static random access memory cell that is part of a memory multi-cell including the static random access memory cell, at least one variable resistance random access memory cell coupled between a charge node of the static random access memory cell and a common node, and a control gate coupled between the common node and a voltage bus, the method comprising:
- obtaining a state associated with the static random access memory cell;
- determining at least one bitline voltage coupled to the static random access memory cell to set resistance of the at least one variable resistance random access memory cell, wherein the at least one variable resistance random access memory cell is external to the static random access memory cell; and
- setting a resistance value of the at least one variable resistance random access memory cell for restoring the state of the static random access memory cell.

17. The method according to claim 16, wherein obtaining the state comprises obtaining the state associated with a portion of a circuit design to be instantiated in programmable circuitry of an integrated circuit.

18. The method according to claim 17, wherein the integrated circuit comprises a programmable logic device.

19. The method according to claim 18, wherein the programmable logic device comprises a field programmable gate array.

20. The method according to claim 16, further comprising:
- powering off the static random access memory cell;
- powering up the static random access memory cell; and
- restoring state of the static random access memory cell based on the resistance value of the at least one variable resistance random access memory cell.

* * * * *